US010361167B2

(12) United States Patent
Liu et al.

(10) Patent No.: US 10,361,167 B2
(45) Date of Patent: Jul. 23, 2019

(54) ELECTRONIC ASSEMBLY USING BISMUTH-RICH SOLDER

(71) Applicant: Intel Corporation, Santa Clara, CA (US)

(72) Inventors: Pilin Liu, Chandler, AZ (US); Purushotham Kaushik Muthur Srinath, Chandler, AZ (US); Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/762,837

(22) PCT Filed: Sep. 25, 2015

(86) PCT No.: PCT/US2015/052443
§ 371 (c)(1),
(2) Date: Mar. 23, 2018

(87) PCT Pub. No.: WO2017/052640
PCT Pub. Date: Mar. 30, 2017

(65) Prior Publication Data
US 2018/0254256 A1 Sep. 6, 2018

(51) Int. Cl.
*H01L 23/00* (2006.01)
*H01L 23/48* (2006.01)
*B23K 35/26* (2006.01)
(Continued)

(52) U.S. Cl.
CPC .......... *H01L 24/81* (2013.01); *B23K 35/0222* (2013.01); *B23K 35/0233* (2013.01);
(Continued)

(58) Field of Classification Search
CPC .................................................... H01L 24/81
See application file for complete search history.

(56) References Cited

U.S. PATENT DOCUMENTS 7,723,225 B2 * 5/2010 Lin ....................... H05K 3/3452
257/753
9,023,717 B2 * 5/2015 Nakagawa .............. H01L 21/78
257/E21.599
(Continued)

FOREIGN PATENT DOCUMENTS

CN           108292610         7/2018
WO       WO-2017052640 A1     3/2017

OTHER PUBLICATIONS

"International Application Serial No. PCT/US2015/052443, International Search Report dated Jun. 22, 2016", 5 pgs.
(Continued)

*Primary Examiner* — William Coleman
(74) *Attorney, Agent, or Firm* — Schwegman Lundberg & Woessner, P.A.

(57) ABSTRACT

Some forms relate to an electronic assembly includes a first substrate that has a copper pad mounted to the first substrate. The electronic assembly further includes a second substrate that includes a copper redistribution layer mounted on the second substrate. The electronic assembly further includes bismuth-rich solder that includes 10-40 w.t. % tin. The bismuth-rich solder is electrically engaged with the copper pad and the copper redistribution layer. In some forms, the copper redistribution layer is another copper pad. The first substrate may include a memory die and the second substrate may include a logic die. In other forms, the first and second substrates may be part of a variety of different electronic components. The types of electronic components that are associated with the first and second substrates will depend on part on the application where the electronic assembly is be utilized (among other factors).

17 Claims, 4 Drawing Sheets

(51) Int. Cl.
*B23K 35/02* (2006.01)
*H01L 21/768* (2006.01)

(52) U.S. Cl.
CPC .......... *B23K 35/0238* (2013.01); *B23K 35/26* (2013.01); *B23K 35/264* (2013.01); *H01L 21/76843* (2013.01); *H01L 23/48* (2013.01); *H01L 24/08* (2013.01); *H01L 24/11* (2013.01); *H01L 24/13* (2013.01); *H01L 24/16* (2013.01); *H01L 24/05* (2013.01); *H01L 2224/0239* (2013.01); *H01L 2224/0401* (2013.01); *H01L 2224/05647* (2013.01); *H01L 2224/11462* (2013.01); *H01L 2224/13082* (2013.01); *H01L 2224/13083* (2013.01); *H01L 2224/13113* (2013.01); *H01L 2224/13147* (2013.01); *H01L 2224/16147* (2013.01); *H01L 2224/81447* (2013.01); *H01L 2224/81815* (2013.01)

(56) References Cited

U.S. PATENT DOCUMENTS

| | | | |
|---|---|---|---|
| 9,272,371 B2 * | 3/2016 | Hoepfner | H05K 1/181 |
| 9,941,207 B2 * | 4/2018 | Lin | H01L 23/5389 |
| 2005/0275096 A1 | 12/2005 | Zeng et al. | |
| 2006/0267157 A1 | 11/2006 | Edwards et al. | |
| 2007/0087473 A1 | 4/2007 | Chou et al. | |
| 2007/0087587 A1 | 4/2007 | Chang et al. | |
| 2007/0152331 A1 | 7/2007 | Kang et al. | |

OTHER PUBLICATIONS

"International Application Serial No. PCT/US2015/052443, Written Opinion dated Jun. 22, 2016", 10 pgs.

* cited by examiner

ELECTRONIC ASSEMBLY USING BISMUTH-RICH SOLDER

CROSS-REFERENCE TO RELATED APPLICATION

This application is a U.S. National Stage Filing under 35 U.S.C. 371 from International Application No. PCT/US2015/052443, filed on Sep. 25, 2015, and published as WO 2017/052640, which application is incorporated herein by reference in its entirety.

BACKGROUND

Solder joint typically includes a nickel bump on one substrate and an electroplated barrier layer on top of a copper pad on another substrate. The electroplated barrier layer is commonly used to protect the copper pad.

There is typically a lack of uniformity in the barrier layer across the copper pad. This lack of uniformity negatively impacts the effectiveness of barrier layer. These barrier layer also usually requires unwanted extra processing steps and increased costs.

In addition, the barrier layer may not be particularly effective in creating a proper solder joint. The copper pad is often totally consumed during the formation of the solder joint. If too much of the copper pad is consumed during formation of solder joint, then the solder joint may form an unreliable electrical connection.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic assemblies and methods described herein use bismuth rich solder to form solder joints that have optimized tin content. Optimizing tin content within the solder joint may resolve redistribution layer copper pad open issues that are caused by full conversion of the copper redistribution layer into an intermetallic compound during assembly processes.

This full conversion of the copper redistribution layer in conventional electronic assemblies and methods is problematic because it is desirable to minimize the thickness of the copper traces. In conventional processes, the thin copper traces can be consumed quickly during multiple reflows that take place during commonly used assembly processes. These multiple reflows can cause the solder joints that are formed to be opened, especially when conventional solders are used.

Figure 1:
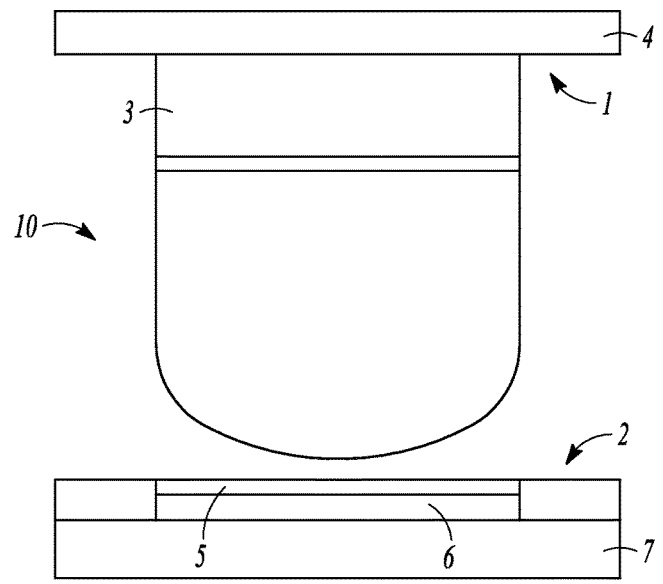
FIG. 1 is a schematic side view of the electronic components in an electronic assembly before the electronic components are assembled together.
Figure 2:
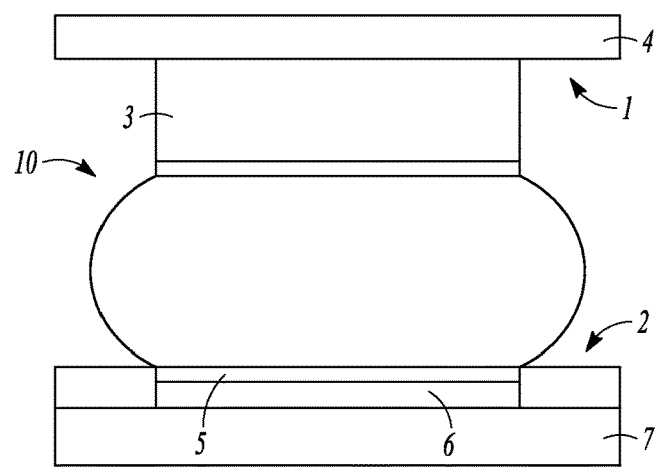
FIG. 2 shows the electronic assembly of FIG. 1 after the electronic components are assembled together to form the electronic assembly.

FIG. 1 is a schematic side view of electronic components 1, 2 in a conventional electronic assembly 10 before the electronic components 1, 2 are assembled together. FIG. 2 shows the electronic assembly 10 of FIG. 1 after the electronic components 1, 2 are assembled together to form the electronic assembly 10.

The solder joint includes a nickel bump 3 on one substrate 4 and further includes an electroplated barrier layer 5 on top of a copper pad 6 on another substrate 7. The electroplated barrier layer 5 is commonly used to protect the copper pad 6.

The solder joint in electronic assembly 10 suffers from several drawbacks. One drawback relates to maintaining quality within the barrier layer 5.

Another drawback relates to a lack of uniformity in the barrier layer 5 across the copper pad 6. This lack of uniformity negatively impacts the effectiveness of barrier layer 5.

The electronic assemblies 10 and associated fabrication processes include unwanted extra processing steps and increased costs. These unwanted extra processing steps and increased costs are most commonly associated with plating the barrier layer 5 onto the copper pad 6.

In addition, the barrier layer 5 may not be particularly effective in creating a proper solder joint. The most predominate concerns relates to the copper pad 6 (or the conductive traces connected to the copper pad 6) being totally consumed during the formation of the solder joint. If too much of the copper pad 6 is consumed during formation of solder joint, then the solder joint may form an unreliable electrical connection.

The electronic assemblies and methods described herein utilize a bismuth-rich solder joint that only provides a limited amount of tin to react with the copper pad. Since the solder joint includes the appropriate amount of tin, the solder joint is optimized to eliminate the copper redistribution layer consumption issue without using any barrier layer. The electronic assemblies and methods described herein are an improvement over conventional approaches that typically require a barrier layer to protect the copper redistribution layer.

Figure 3:
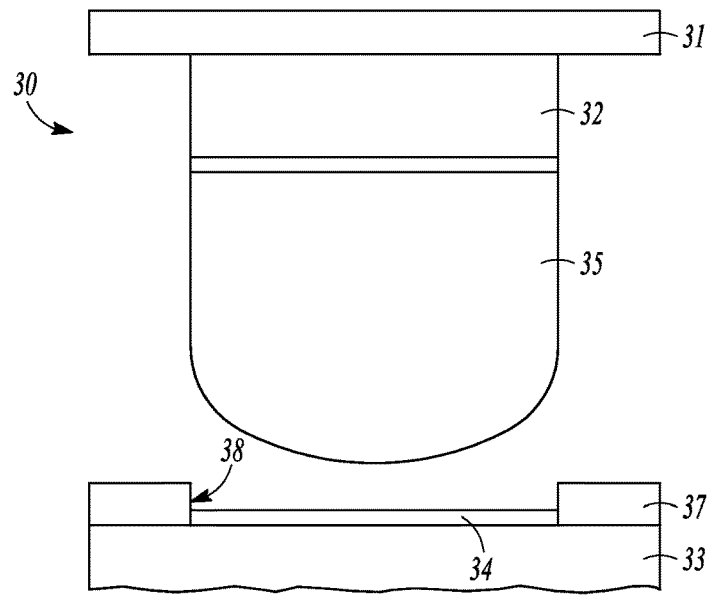
FIG. 3 is a schematic side view of the electronic components in an example electronic assembly before the electronic components are assembled together.
Figure 4:
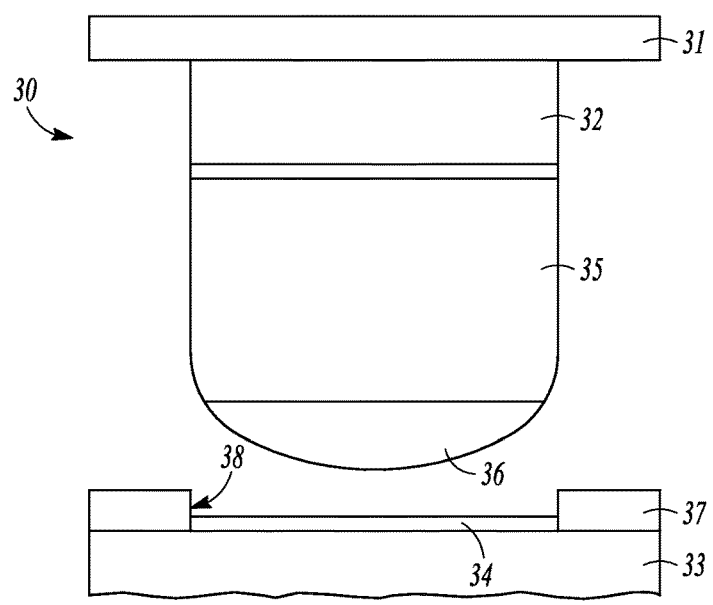
FIG. 4 is a schematic side view of the electronic components in another example electronic assembly before the electronic components are assembled together.
Figure 5:
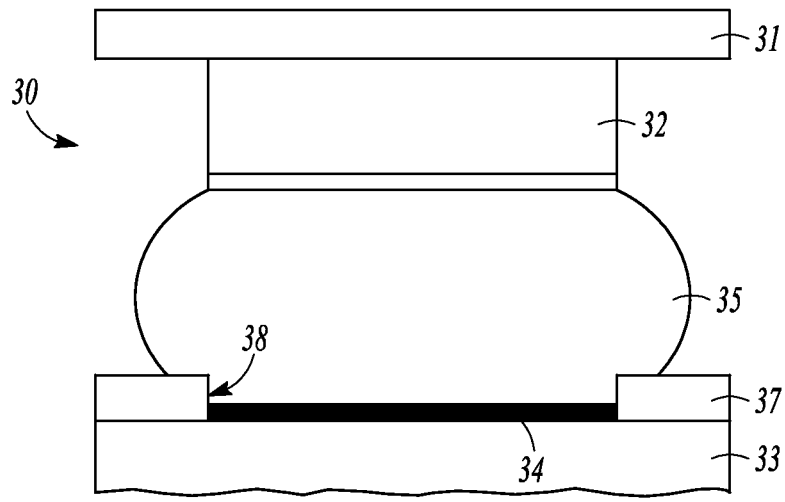
FIG. 5 shows the example electronic assembly of FIG. 3 or 4 after the electronic components are assembled together to form the electronic assembly.

FIG. 3 is a schematic side view of the electronic components in an example electronic assembly 30 before the electronic components are assembled together. FIG. 4 is a schematic side view of the electronic component shown in FIG. 3 where a bismuth-rich solder includes eutectic tin-bismuth solder before the electronic components are assembled together. FIG. 5 shows the example electronic assemblies 30 of FIG. 3 or 4 after the electronic components are assembled together to form the electronic assembly 30.

As shown in FIGS. 3 and 5, the electronic assembly 30 includes a first substrate 31 that has a copper pad 32 mounted to the first substrate 31. The electronic assembly further includes a second substrate 33 that includes a copper redistribution layer 34 mounted on the second substrate 33.

The electronic assembly further includes bismuth-rich solder 35 that includes 10-40 w.t. % tin. The bismuth-rich solder 35 is electrically engaged with the copper pad 32 and the copper redistribution layer 34.

As one example, the bismuth-rich solder 35 may include 10-40 w.t. % tin and the remainder of the bismuth-rich solder 35 is bismuth. As another example, the bismuth-rich solder 35 may include 10-40 w.t. % tin and the majority (i.e., greater that 50 w.t. %) of the bismuth-rich solder 35 may be bismuth. As another example, the bismuth-rich solder 35 may include 10-40 w.t. % tin and 60-90 w.t. % bismuth.

It should be noted that the bismuth-rich solder 35 may have a reflow temperature between 170 and 260 degrees centigrade. More specifically, the bismuth-rich solder 35 may have a reflow temperature between 180 and 220 degrees centigrade.

In some forms, the copper redistribution layer 34 is another copper pad. It should be noted that the copper redistribution layer 34 may take a variety of forms and be a variety of different materials depending on the application where the electronic assembly is to be used as well as the manufacturing processes that are used to fabricate the electronic assembly 30.

As examples, the first substrate 31 may include a memory die and the second substrate 33 may include a logic die. In other forms, the first and second substrates 31, 33 may be part of a variety of different electronic components. The types of electronic components that are associated with the first and second substrates 31, 33 will depend on part on the application where the electronic assembly 30 is be utilized (among other factors).

As shown in FIG. 4, the bismuth-rich solder 35 may include eutectic tin-bismuth solder 36 that engages the copper redistribution layer 34. As an example, the eutectic tin-bismuth solder 36 may be electroplated to the bismuth-rich solder 35, although other forms of attaching the eutectic tin-bismuth solder 36 to the bismuth-rich solder 35 are contemplated.

In some forms, the eutectic tin-bismuth solder 36 is 1-3 micrometers thick before attaching the first substrate 31 to the second substrate 33. In addition, the bismuth-rich solder 35 may have a z-height of 10-15 micrometers before attaching the first substrate 31 to the second substrate 33.

The eutectic bismuth-rich solder 36 may be added to the bismuth-rich solder 35 to improve wettability of the bismuth-rich solder. Improving the wettability of the bismuth-rich solder 35 may improve the formation of the solder joint.

FIGS. 3-5 show that the electronic assembly 30 may further include a passivation layer 37 on the second substrate 33. The passivation layer 37 may include an opening 38 such that the copper redistribution layer 34 is exposed through the opening 38.

It should be noted that only tin will react with the copper redistribution layer 34 during manufacturing processes. The bismuth will not react with the copper redistribution layer 34. The amount of tin is optimized so that the copper redistribution layer 34 will not be fully consumed during reflow operations.

Figure 6:
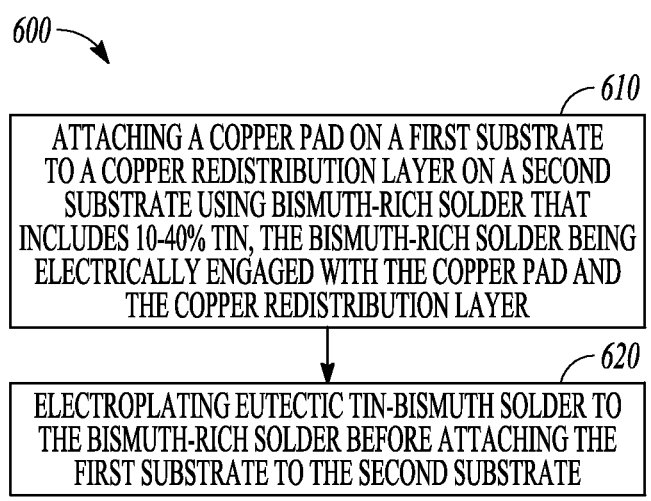
FIG. 6 is a flow diagram illustrating an example method of fabricating an electronic assembly.

FIG. 6 is a flow diagram illustrating an example method [600] of fabricating an electronic assembly. The method [600] includes [610] attaching a copper pad 32 on a first substrate 31 to a copper redistribution layer 34 on a second substrate 33 using bismuth-rich solder 35 that includes 10-40 w.t. % tin. The bismuth-rich solder 35 is electrically engaged with the copper pad 32 and the copper redistribution layer 34 (see FIG. 5).

Attaching a copper pad 32 on a first substrate to a copper redistribution layer 34 on a second substrate 33 may include attaching a logic die to a memory die. The first and second substrates 31, 33 may be part of other types of electronic components. The type of electronic component that is used in the method [600] will depend in part on the application where the electronic assembly 30 is to be used.

Method [600] may further include [620] electroplating eutectic tin-bismuth solder 36 (see FIG. 4) to the bismuth-rich solder 35 before attaching the first substrate 31 to the second substrate 33. The eutectic tin-bismuth solder 36 may be attached to the bismuth-rich solder 35 in any manner that is known now, or discovered in the future.

The eutectic tin-bismuth solder 36 may improve the wettability of the bismuth-rich solder 35. In some forms, electroplating eutectic tin-bismuth solder 36 to the bismuth-rich solder 35 includes electroplating 1-3 microns of eutectic tin-bismuth solder 36 to the bismuth-rich solder 35.

In some forms, [610] attaching a copper pad 32 on a first substrate 31 to a copper redistribution layer 34 on a second substrate 33 may include (i) attaching the copper pad 32 on the first substrate 31 to another copper pad on the second substrate 33; (ii) soldering the copper pad 32 to the copper redistribution layer 34 at a temperature between 170 and 260° C.; and/or (iii) positioning the bismuth-rich solder 35 within an opening 38 in a passivation layer 37 on the second substrate 33. The use of bismuth-rich solder 35 may provide the flexibility to use a variety of temperatures when soldering the first substrate 31 to the second substrate 33.

The electronic assemblies 30 and methods [600] described herein may provide an improved solder joint since conventional joints often fully consume the copper in a copper redistribution layer during assembly processes. In addition, the electronic assemblies 30 and methods [600] described herein may eliminate the need for a barrier layer thereby simplifying the fabrication processes and potentially reducing the overall fabrication costs.

Figure 7:
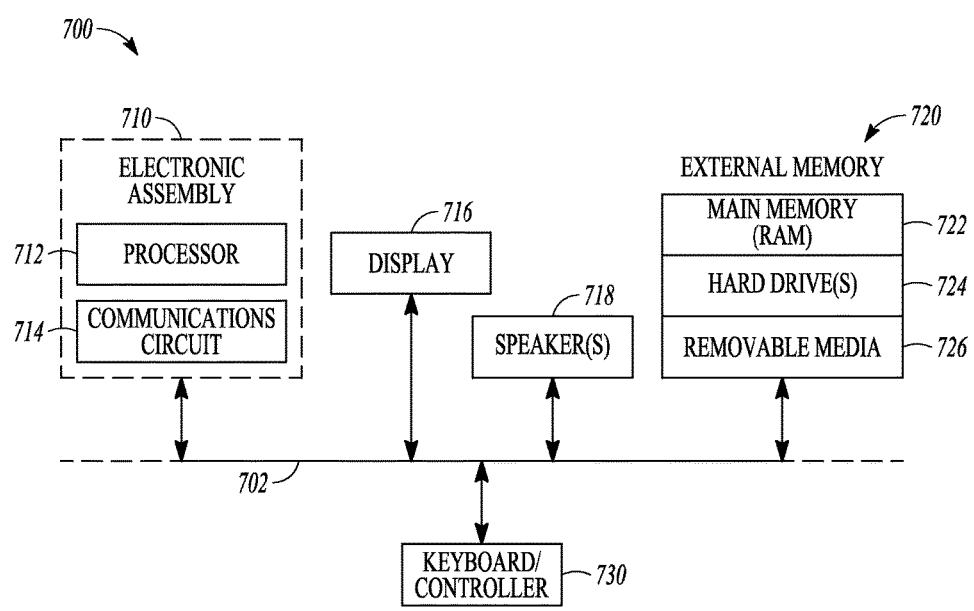
FIG. 7 is block diagram of an electronic apparatus that includes the electronic assemblies and/or methods described herein.

FIG. 7 is a block diagram of an electronic apparatus 700 incorporating at least one of the electronic assemblies 30 and/or methods [600] described herein. Electronic apparatus 700 is merely one example of an electronic apparatus in which forms of the electronic assemblies 30 and/or methods [600] described herein may be used. Examples of an electronic apparatus 700 include, but are not limited to, personal computers, tablet computers, mobile telephones, game devices, MP3 or other digital media players, etc.

In this example, electronic apparatus 700 comprises a data processing system that includes a system bus 702 to couple the various components of the electronic apparatus 700. System bus 702 provides communications links among the various components of the electronic apparatus 700 and may be implemented as a single bus, as a combination of busses, or in any other suitable manner.

An electronic apparatus 700 as described herein may be coupled to system bus 702. The electronic apparatus 700 may include any circuit or combination of circuits. In one embodiment, the electronic apparatus 700 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 700 are a custom circuit, an application-specific integrated circuit (ASIC), or the like, such as, for example, one or more circuits (such as a communications circuit 714) for use in wireless devices like mobile telephones, tablet computers, laptop computers, two-way radios, and similar electronic systems. The IC can perform any other type of function.

The electronic apparatus 700 may also include an external memory 720, which in turn may include one or more memory elements suitable to the particular application, such as a main memory 722 in the form of random access memory (RAM), one or more hard drives 724, and/or one or more drives that handle removable media 726 such as compact disks (CD), flash memory cards, digital video disk (DVD), and the like.

The electronic apparatus 700 may also include a display device 716, one or more speakers 718, and a keyboard and/or controller 730, which can include a mouse, trackball, touch pad, voice-recognition device, or any other device that permits a system user to input information into and receive information from the electronic apparatus 700.

To better illustrate the electronic assemblies and/or methods disclosed herein, a non-limiting list of examples is provided herein:

Example 1 includes an electronic assembly having a first substrate, wherein a copper pad is mounted to the first substrate; a second substrate that includes a copper redistribution layer mounted on the second substrate; and a bismuth-rich solder that includes 10-40 w.t. % tin, the bismuth-rich solder being electrically engaged with the copper pad and the copper redistribution layer.

Example 2 includes the electronic assembly of example 1, wherein the copper redistribution layer is another copper pad.

Example 3 includes the electronic assembly of any one of examples 1 to 2, wherein the first substrate includes a memory die.

Example 4 includes the electronic assembly of any one of examples 1 to 3, wherein the second substrate includes a logic die.

Example 5 includes the electronic assembly of any one of examples 1 to 4, wherein the bismuth-rich solder includes eutectic tin-bismuth solder that engages the copper redistribution layer.

Example 6 includes the electronic assembly of any one of examples 1 to 5, wherein the eutectic tin-bismuth solder is electroplated to the bismuth-rich solder.

Example 7 includes the electronic assembly of any one of examples 1 to 6, wherein the eutectic tin-bismuth solder is 1-3 micrometers thick before attaching the first substrate to the second substrate.

Example 8 includes the electronic assembly of any one of examples 1 to 7, wherein the bismuth-rich solder has a z-height of 10-15 micrometers before attaching the first substrate to the second substrate.

Example 9 includes the electronic assembly of any one of examples 1 to 8, and further including a passivation layer on the copper redistribution layer.

Example 10 includes the electronic assembly of any one of examples 1 to 9, wherein the passivation layer includes an opening such that the copper redistribution layer is exposed through the opening.

Example 11 includes the electronic assembly of any one of examples 1 to 10, wherein the bismuth-rich solder includes 10-40 w.t. % tin and the remainder of the bismuth-rich solder is bismuth.

Example 12 includes the electronic assembly of any one of examples 1 to 10, wherein the bismuth-rich solder includes 10-40 w.t. % tin and a majority of the bismuth-rich solder may be bismuth.

Example 13 includes the electronic assembly of any one of examples 1 to 10, wherein the bismuth-rich solder includes 10-40 w.t. % tin and 60-90 w.t. % bismuth.

Example 14 includes the electronic assembly of any one of examples 1 to 13, wherein the bismuth-rich solder has a reflow temperature between 170 and 260 degrees centigrade.

Example 15 includes a method of fabricating an electronic assembly comprising attaching a copper pad on a first substrate to a copper redistribution layer on a second substrate using bismuth-rich solder that includes 10-40 w.t. % tin, the bismuth-rich solder being electrically engaged with the copper pad and the copper redistribution layer.

Example 16 includes the method of example 15, and further including electroplating eutectic tin-bismuth solder to the bismuth-rich solder before attaching the first substrate to the second substrate.

Example 17 includes the method of any one of examples 15 to 16, wherein attaching a copper pad on a first substrate to a copper redistribution layer on a second substrate using bismuth-rich solder includes soldering the copper pad to the copper redistribution layer at a temperature between 170 and 260 degrees centigrade.

Example 18 is a method of fabricating an electronic assembly comprising electroplating eutectic tin-bismuth solder to bismuth-rich solder that includes 10-40 w.t. % tin; and soldering a first copper pad on a first substrate to a second copper pad on a second substrate using the bismuth-rich solder at a temperature between 170 and 260 degrees centigrade.

Example 19 includes the computer system assembly of example 18, wherein soldering a first copper pad on a first substrate to a second copper pad on a second substrate include soldering the first copper pad on a logic die to the second copper pad on a memory die.

Example 20 includes the computer system assembly of any one of examples 18 to 19, and further including positioning the bismuth-rich solder within an opening in a passivation layer before soldering the first copper pad to the second copper pad.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic assembly comprising:
   a first substrate, wherein a copper pad is mounted to the first substrate;
   a second substrate that includes a copper redistribution layer mounted on the second substrate; and
   a non-eutectic bismuth-rich solder that includes 10-40 wt. % tin, the bismuth-rich solder being electrically engaged with the copper pad and the copper redistribution layer, wherein the non-eutectic bismuth-rich solder includes eutectic tin-bismuth solder that engages the copper redistribution layer, wherein the eutectic tin-bismuth solder is electroplated to the non-eutectic bismuth-rich solder.

2. The electronic assembly of claim 1, wherein the copper redistribution layer is another copper pad.

3. The electronic assembly of claim 1, wherein the first substrate includes a memory die.

4. The electronic assembly of claim 1, wherein the second substrate includes a logic die.

5. The electronic assembly of claim 1, wherein the eutectic tin-bismuth solder is 1-3 micrometers thick before attaching the first substrate to the second substrate.

6. The electronic assembly of claim 1, wherein the non-eutectic bismuth-rich solder has a z-height of 10-15 micrometers before attaching the first substrate to the second substrate.

7. The electronic assembly of claim 1, further comprising a passivation layer on the copper redistribution layer.

8. The electronic assembly of claim 1, wherein the passivation layer includes an opening such that the copper redistribution layer is exposed through the opening.

9. The electronic assembly of claim 1, wherein the non-eutectic bismuth-rich solder includes 10-40 w.t. % tin and the remainder of the non-eutectic bismuth-rich solder is bismuth.

10. The electronic assembly of claim 1, wherein the non-eutectic bismuth-rich solder includes 10-40 wt. % tin and a majority of the non-eutectic bismuth-rich solder may be bismuth.

11. The electronic assembly of claim 1, wherein the non-eutectic bismuth-rich solder includes 10-40 wt. % tin and 60-90 w.t. % bismuth.

12. The electronic assembly of claim 1, wherein the non-eutectic bismuth-rich solder has a reflow temperature between 170 and 260 degrees centigrade.

13. A method of fabricating an electronic assembly comprising:
   attaching a copper pad on a first substrate to a copper redistribution layer on a second substrate using non-eutectic bismuth-rich solder that includes 10-40 w.t. % tin, the non-eutectic bismuth-rich solder being electrically engaged with the copper pad and the copper redistribution layer; and
   electroplating eutectic tin-bismuth solder to the non-eutectic bismuth-rich solder before attaching the first substrate to the second substrate.

14. The method of claim 13, wherein attaching a copper pad on a first substrate to a copper redistribution layer on a second substrate using the non-eutectic bismuth-rich solder includes soldering the copper pad to the copper redistribution layer at a temperature between 170 and 260 degrees centigrade.

15. A method of fabricating an electronic assembly comprising:
   electroplating eutectic tin-bismuth solder to non-eutectic bismuth-rich solder that includes 10-40 w.t. % tin; and
   soldering a first copper pad on a first substrate to a second copper pad on a second substrate using the non-eutectic bismuth-rich solder at a temperature between 170 and 260 degrees centigrade.

16. The method of claim 15, wherein soldering a first copper pad on a first substrate to a second copper pad on a second substrate include soldering the first copper pad on a logic die to the second copper pad on a memory die.

17. The method of claim 15, further comprising positioning the non-eutectic bismuth-rich solder within an opening in a passivation layer before soldering the first copper pad to the second copper pad.

* * * * *